(12) United States Patent
Yan

(10) Patent No.: US 7,723,726 B2
(45) Date of Patent: May 25, 2010

(54) THIN FILM TRANSISTOR SUBSTRATE WITH BONDING LAYER AND METHOD FOR FABRICATING THE SAME

(75) Inventor: Shuo-Ting Yan, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 238 days.

(21) Appl. No.: 11/985,114

(22) Filed: Nov. 13, 2007

(65) Prior Publication Data
US 2008/0111137 A1 May 15, 2008

(30) Foreign Application Priority Data
Nov. 10, 2006 (TW) .............................. 95141785 A

(51) Int. Cl.
*H01L 27/14* (2006.01)
(52) U.S. Cl. .................. 257/59; 257/E29.132; 249/158
(58) Field of Classification Search .................. 257/59, 257/E29.132, E31.041; 349/158
See application file for complete search history.

(56) References Cited

U.S. PATENT DOCUMENTS

| 5,440,168 A | 8/1995 | Nishimura et al. |
| 6,160,270 A * | 12/2000 | Holmberg et al. ............. 257/59 |
| 6,255,706 B1 | 7/2001 | Watanabe et al. |
| 6,562,668 B2 | 5/2003 | Jang et al. |
| 6,649,936 B1 | 11/2003 | Sung et al. |
| 2006/0110866 A1 | 5/2006 | Gan et al. |
| 2006/0138659 A1 | 6/2006 | Liu et al. |

FOREIGN PATENT DOCUMENTS

| CN | 1558447 A | 12/2004 |
| TW | 452986 B | 9/2001 |
| TW | 200622457 A | 7/2006 |

\* cited by examiner

*Primary Examiner*—Thomas L Dickey
(74) *Attorney, Agent, or Firm*—Wei Te Chung

(57) ABSTRACT

An exemplary thin film transistor substrate (30) includes a base substrate (31) and a gate electrode (32) formed on the base substrate. The gate electrode includes a bonding layer (321) formed on the base substrate and an electrically conductive layer (322) formed on the bonding layer. The bonding layer includes one of aluminum oxide and zirconium dioxide.

20 Claims, 5 Drawing Sheets

THIN FILM TRANSISTOR SUBSTRATE WITH BONDING LAYER AND METHOD FOR FABRICATING THE SAME

CROSS-REFERENCE TO RELATED APPLICATION

This application is related to, and claims the benefit of, a foreign priority application filed in Taiwan as Serial No. 095141785 on Nov. 10, 2006. The related application is incorporated herein by reference.

FIELD OF THE INVENTION

The present invention relates to thin film transistor (TFT) substrates, and more particularly to a thin film transistor substrate for a liquid crystal display and a method for fabricating the thin film transistor substrate.

GENERAL BACKGROUND

Typically, liquid crystal displays (LCDs) utilize thin film transistors as switching elements. The liquid crystal display generally includes a thin film transistor substrate, on which the thin film transistors are formed.

FIG. 14 is a cross-sectional view of part of a conventional thin film transistor substrate. The TFT substrate 10 includes a base substrate 11, a gate electrode 12 formed on the base substrate 11, a gate insulating layer 13 covering the gate electrode 12 and the base substrate 11, an amorphous silicon (a-Si) layer 14 corresponding to the gate electrode 12 and formed on the gate insulating layer 13, two impurity-doped a-Si layers 18 formed on the a-Si layer 14 and being generally opposite to each other, a source electrode 15 formed on one of the impurity-doped a-Si layers 18, a drain electrode 16 formed on the other impurity-doped a-Si layer 18 and being generally opposite to the source electrode 15, and a passivation layer 17 covering the source electrode 15 and the drain electrode 16.

The gate electrode 12 is made of copper (Cu) to minimize resistance-capacitance (RC) delay caused by parasitic capacitors and parasitic resistors between the gate electrode 12 and a corresponding gate line (not shown). However, the adhesion strength between the copper gate electrode 12 and the base substrate 11 is weak. As a result, the gate electrode 12 may desquamate from the base substrate 11.

Referring also to FIG. 15, this is a cross-sectional view of part of another conventional thin film transistor substrate. The thin film transistor substrate 20 includes a base substrate 21, and a gate electrode 22 formed on the base substrate 21. The gate electrode 22 includes a barrier layer 223, a conductive layer 222, and a bonding layer 221, disposed in that order from top to bottom. The bonding layer 221 is formed on the base substrate 21 and is made of molybdenum (Mo). The conductive layer 222 is made of copper.

The main constituent of the base substrate 21 is silicon dioxide ($SiO_2$). Most metallic materials have weak adhesion with silicon dioxide. Typically, the adhesion strength between a metallic material and silicon dioxide ranges from 0.5 joules per square meter (J/sq.m.) to 2 joules per square meter. That is, the effect using molybdenum as a bonding layer 221 to increase the adhesion strength between the gate electrode 22 and the base substrate 21 is limited. As a result, when the TFT substrate 20 sustains significant shock, the gate electrode 22 may desquamate from the base substrate 21.

What is needed, therefore, is a thin film transistor substrate and a method for fabricating the thin film transistor that can overcome the above-described deficiencies.

SUMMARY

A thin film transistor substrate includes a base substrate and a gate electrode formed on the base substrate. The gate electrode includes a bonding layer formed on the base substrate and an electrically conductive layer formed on the bonding layer. The bonding layer includes one of aluminum oxide and zirconium dioxide.

A method for fabricating a thin film transistor substrate includes the following steps: providing a base substrate; forming a bonding layer, the bonding layer having one of aluminum oxide and zirconium dioxide on the base substrate; forming a conductive layer and a photo-resistor layer on the aluminum oxide layer or the zirconium dioxide layer; applying an exposing process on the photo-resistor layer through a mask and developing the photo-resistor layer; etching the conductive layer; and ashing the photo-resistor layer so as to obtain a gate electrode on the base substrate.

Other novel features and advantages will become more apparent from the following detailed description when taken in conjunction with the accompanying drawings.

DETAILED DESCRIPTION OF PREFERRED EMBODIMENTS

Reference will now be made to the drawings to describe preferred and exemplary embodiments in detail.

Figure 1:
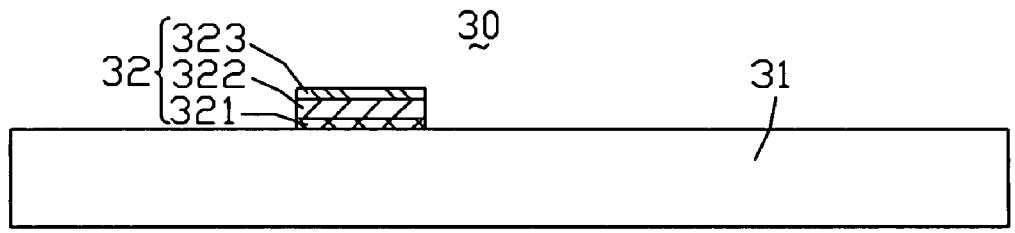
FIG. 1 is a cross-sectional view of part of a thin film transistor substrate according to a first embodiment of the present invention.

FIG. 1 is a cross-sectional view of part of a thin film transistor substrate 30 according to a first embodiment of the present invention. The thin film transistor substrate 30 includes a base substrate 31, and a gate electrode 32 formed on the base substrate 31. The gate electrode 32 includes a barrier layer 323, an electrically conductive layer 322, and a bonding layer 321, disposed from top to bottom in that order.

The main constituent of the base substrate 31 is silicon dioxide. The bonding layer 321 is formed on the base substrate 31. The bonding layer 321 has a thickness in the range of 5 to 30 nanometers, and a preferred material of the bonding layer 321 is aluminum oxide ($Al_2O_3$). The conductive layer 322 has a thickness in the range of 200 to 400 nanometers, and a preferred material of the conductive layer 322 is copper. The barrier layer 323 has a thickness in the range of 5 to 30 nanometers, and a preferred material of the barrier layer 323 is titanium nitride (TiN).

One surface of the bonding layer 321 contacts the base substrate 31. The adhesion strength between the aluminum oxide of the bonding layer 321 and the silicon dioxide of the base substrate 31 is about 48 joules per square meter. The adhesion strength is sufficient to enable the bonding layer 321 to be tightly attached to the base substrate 31.

The other surface of the bonding layer 321 contacts the conductive layer 322. Therefore, the bonding layer 321 and the conductive layer 322 define an interface (not labeled) therebetween. Chemical reaction occurs between the aluminum oxide of the bonding layer 321 and the copper of the conductive layer 322. That is, ionic bonds such as Cu—O ionic bonds and covalent bonds such as Cu—Al covalent bonds are formed at the interface. The adhesion strength formed by the Cu—O ionic bonds and the Cu—Al covalent bonds is sufficient. Therefore, the conductive layer 322 is tightly attached to the bonding layer 321.

Figure 2:
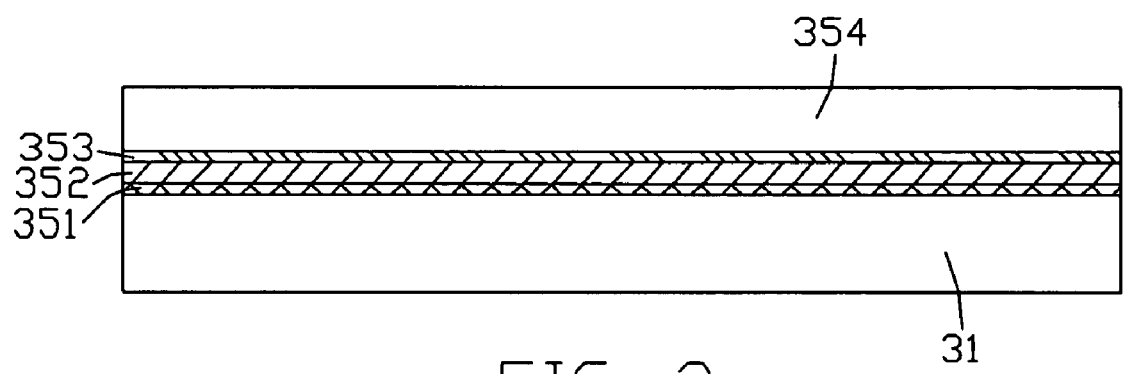
FIGS. 2 to 5 are sectional views showing sequential steps in fabricating the thin film transistor substrate of FIG. 1 according to a method of an exemplary embodiment of the present invention.

Referring to FIGS. 2 to 5, these are sectional views of sequential steps in fabricating the thin film transistor substrate 30 according to a method of an exemplary embodiment of the present invention. For convenience, unless the context indicates otherwise, the method is described and shown only in relation to that part of the thin film transistor substrate 30 shown in FIG. 1. Firstly, as shown in FIG. 2, the substrate 31 is provided. Then, an aluminum oxide layer 351, a copper layer 352, a titanium nitride layer 353, and a photo-resist (PR) layer 354 are deposited on the substrate 31 from bottom to top in that order. In the process of deposition of the aluminum oxide layer 351, oxygen is provided to enable the aluminum oxide layer 351 to be oxidized sufficiently. As a result, more Cu—O ionic bonds are generated. The oxygen flow rate may vary in a range from 5 to 15 standard cubic centimeters per minute (sccm).

Figure 3:
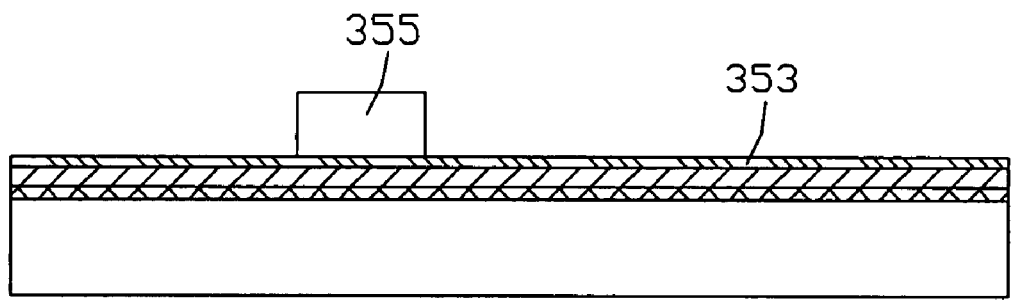

Subsequently, referring also to FIG. 3, a mask (not shown) is utilized so as to define a predetermined pattern over the PR layer 354. Thereby, after an exposing and developing process, a PR pattern 355 is formed according to the mask and covers part of the titanium nitride layer 353. The PR pattern 355 is used as an etching mask.

Figure 4:
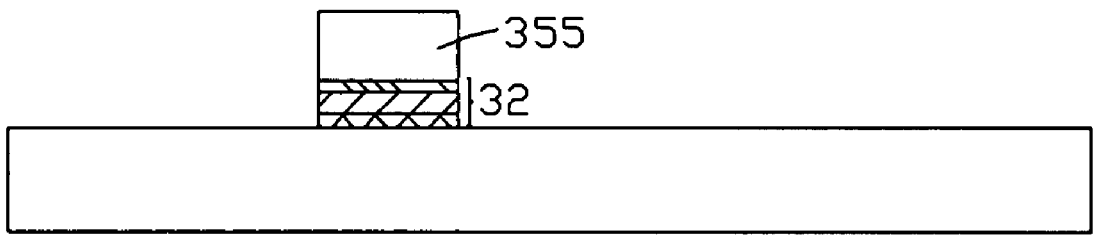

Afterward, referring also to FIG. 4, uncovered portions of the titanium nitride layer 353, the copper layer 352, and the aluminum oxide layer 351 are etched away. Thereby, the remaining portions of the titanium nitride layer 353, the copper layer 352, and the aluminum oxide layer 351 cooperatively form the gate electrode 32 under the PR pattern 355.

Figure 5:
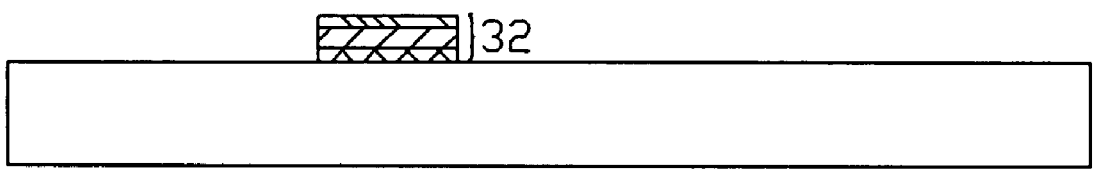

Finally, referring also to FIG. 5, the PR pattern 355 is ashed so as to expose the gate electrode 32.

The gate electrode 32 includes a barrier layer 323, a conductive layer 322, and a bonding layer 321. The material of the bonding layer 321 is aluminum oxide, and the main constituent of the base substrate 31 is silicon dioxide. Because the adhesion strength between the aluminum oxide and the silicon dioxide is about 48 joules per square meter, the bonding layer 321 is tightly attached to the base substrate 31.

Furthermore, the Cu—O ionic bonds and the Cu—Al covalent bonds are formed at the interface of the bonding layer 321 and the conductive layer 322. In the process of deposition of the aluminum oxide layer 351, oxygen is provided to generate more Cu—O ionic bonds. Because the adhesion strength formed by the Cu—O ionic bonds and the Cu—Al covalent bonds is sufficient, the conductive layer 322 is tightly attached to the bonding layer 321. Therefore, the conductive layer 322 is tightly attached to the base substrate 31 via the bonding layer 321. That is, the gate electrode 32 is tightly attached to the base substrate 31.

Figure 6:
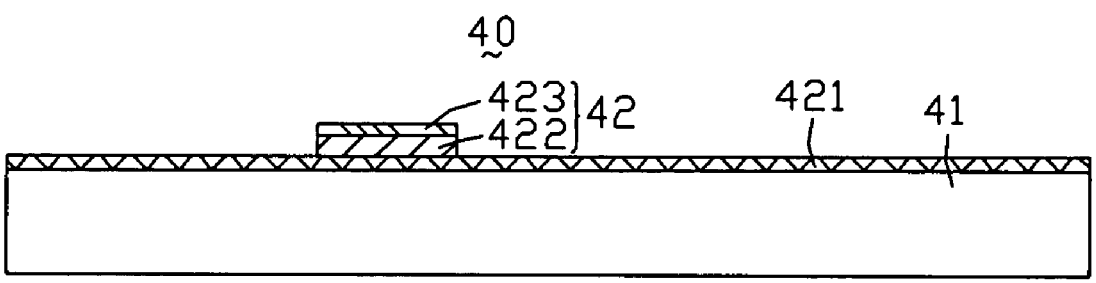
FIG. 6 is a cross-sectional view of part of a thin film transistor substrate according to a second embodiment of the present invention.

FIG. 6 is a cross-sectional view of part of a thin film transistor substrate 40 according to a second embodiment of the present invention. The thin film transistor substrate 40 has a structure similar to that of the thin film transistor substrate 30. However, the thin film transistor substrate 40 includes a base substrate 41, a bonding layer 421 covering substantially all the base substrate 41, and a gate electrode 42 formed on the bonding layer 421. A preferred material of the bonding layer 421 is zirconium dioxide ($ZrO_2$). The main constituent of the base substrate 41 is silicon dioxide.

The gate electrode 42 includes a conductive layer 422 formed on the bonding layer 421, and a barrier layer 423 formed on the conductive layer 422. The conductive layer 422 has a thickness in the range of 200 to 400 nanometers, and a material of the conductive layer 422 can be an alloy of copper and molybdenum. The barrier layer 423 has a thickness in the range of 5 to 30 nanometers, and a preferred material of the barrier layer 423 is tantalum nitride (TaN). The adhesion strength between the zirconium dioxide of the bonding layer 421 and the silicon dioxide of the base substrate 41 is in the range of 53 joules per square meter to 79 joules per square meter.

A typical method for fabricating the thin film transistor substrate 40 is similar to the above-described method for fabricating the thin film transistor substrate 30. However, in a process of forming the gate electrode 42, only the barrier layer 423 and the conductive layer 422 are etched away, leaving the bonding layer 421 remaining on the base substrate 41.

In this embodiment, only the barrier layer 423 and the conductive layer 422 are etched away, with the bonding layer 421 remaining on the base substrate 41. This reduces the time needed to form the gate electrode 42. Furthermore, the bonding layer 421 is made of zirconium dioxide. The zirconium dioxide has stronger adhesion strength with the silicon dioxide of the base substrate 41. In addition, the bonding layer 421 has a very large contact area with the base substrate 41. Therefore, the gate electrode 42 is attached to the base substrate 41 very tightly via the expansive bonding layer 421.

Figure 7:
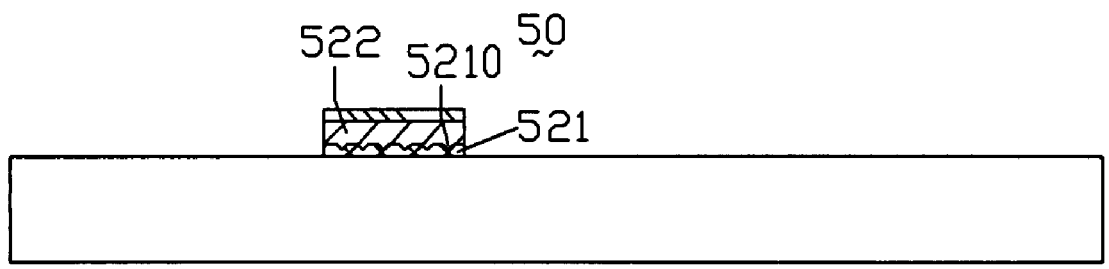
FIG. 7 is a cross-sectional view of part of a thin film transistor substrate according to a third embodiment of the present invention.
Figure 8:
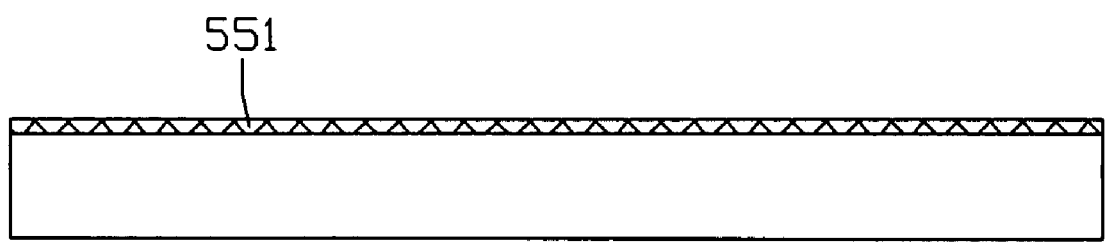
FIGS. 8 to 13 are sectional views showing sequential steps in fabricating the thin film transistor substrate of FIG. 7 according to a method of an exemplary embodiment of the present invention.
Figure 9:
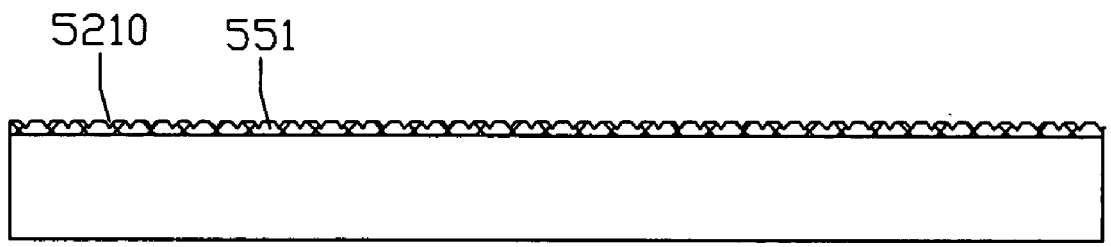
Figure 10:
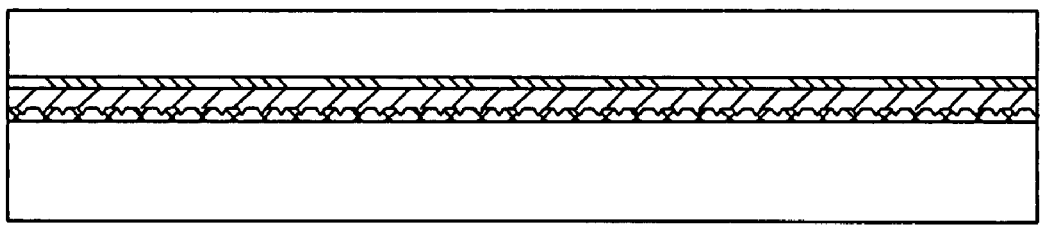
Figure 11:
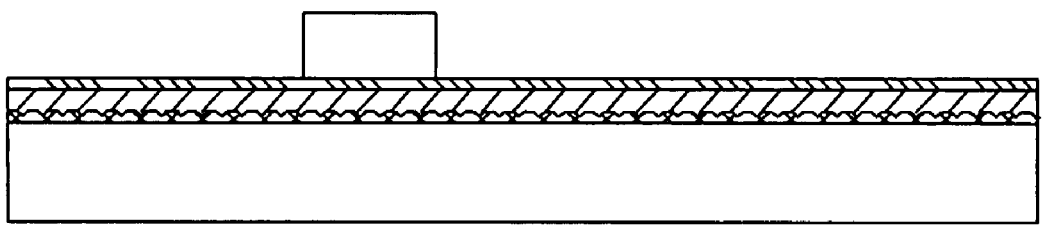
Figure 12:
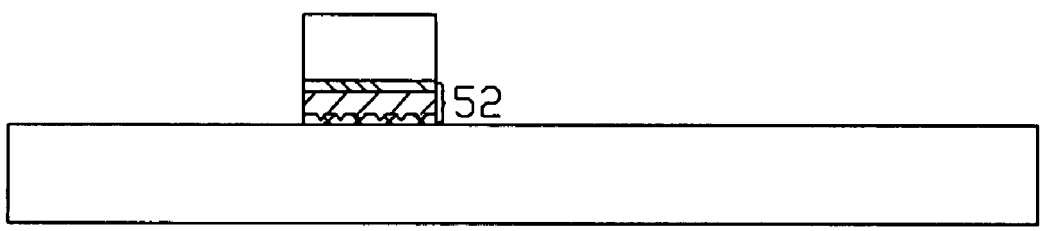
Figure 13:
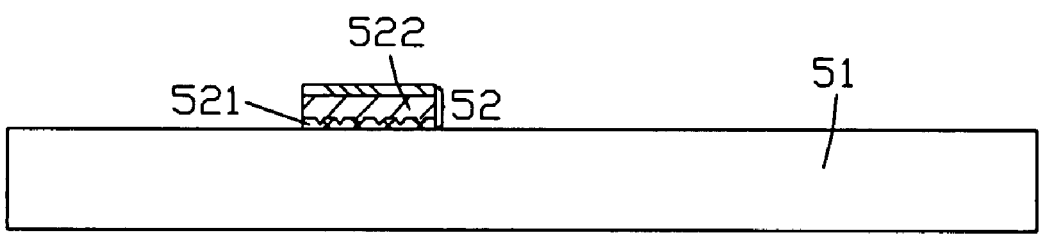
Figure 14:
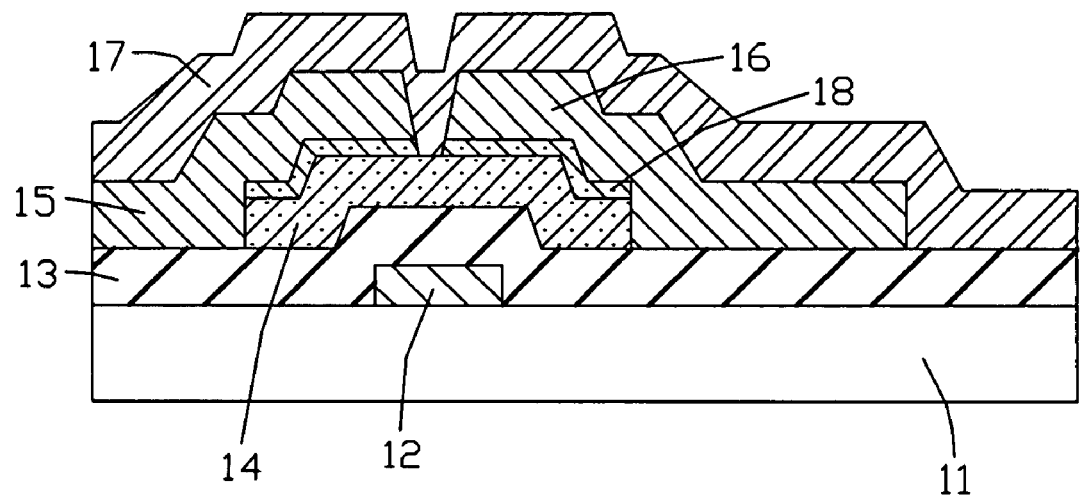
FIG. 14 is a cross-sectional view of part of a conventional thin film transistor substrate.
Figure 15:
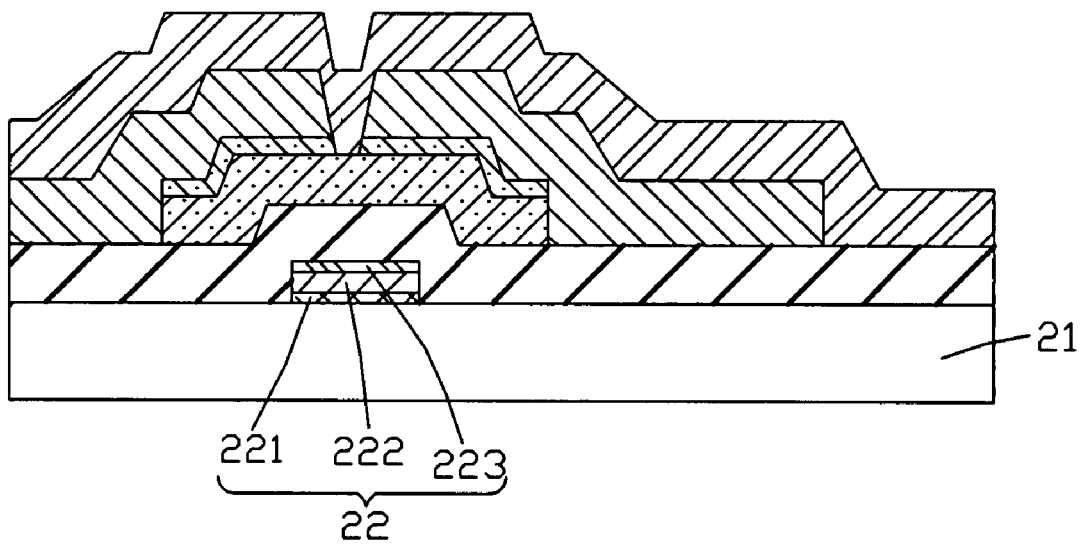
FIG. 15 is a cross-sectional view of part of another conventional thin film transistor substrate.

FIG. 7 is a cross-sectional view of part of a thin film transistor substrate 50 according to a third embodiment of the present invention. The thin film transistor substrate 50 has a structure similar to that of the thin film transistor substrate 30. However, a bonding layer 521 includes a plurality of micro-grooves 5210 on a top surface that contacts a conductive layer 522.

Referring also to FIGS. 8 to 13, these are sectional views of sequential steps in fabricating the thin film transistor substrate 50 according to a method of an exemplary embodiment of the present invention. For convenience, unless the context indicates otherwise, the method is described and shown only in relation to that part of the thin film transistor substrate 50 shown in FIG. 7. The method for fabricating the thin film transistor substrate 50 is similar to the above-described method for fabricating the thin film transistor substrate 30. However, in a process of depositing an aluminum oxide layer 551, a top surface of the aluminum oxide layer 551 is plasma-treated with ammonia so as to form the micro-grooves 5210. The ammonia flow rate is below 50 sccm, and the environmental temperature is below 300° Centigrade. Power for generating the ammonia plasma is below 500 watts.

In this embodiment, the bonding layer 521 includes a plurality of micro-grooves 5210 on the top surface that contacts the conductive layer 522. This enlarges the contact area between the bonding layer 521 and the conductive layer 522.

Therefore, more Cu—O ionic bonds and Cu—Al covalent bonds are formed at an interface of the bonding layer 521 and the conductive layer 522. This increases the adhesion strength between the conductive layer 522 and the bonding layer 521. Thus, a gate electrode 52 having the bonding layer 521 and the conductive layer 522 is attached to a base substrate 51 more tightly.

Various modifications and alterations to the above-described embodiments are possible. For example, the material of the conductive layer may be an alloy of copper and chromium (Cr) or an alloy of copper and tungsten (W). In another example, the material of the barrier layer may be tungsten nitride (WN).

It is to be further understood that even though numerous characteristics and advantages of the present embodiments have been set out in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A thin film transistor substrate, comprising:
    a base substrate; and
    a gate electrode formed on the base substrate, the gate electrode comprising:
    a bonding layer formed on the base substrate, the bonding layer comprising one of aluminum oxide and zirconium dioxide; and
    an electrically conductive layer formed on the bonding layer;
    wherein the bonding layer comprises a plurality of micro-grooves on a surface thereof adjacent to the conductive layer.

2. The thin film transistor substrate as claimed in claim 1, wherein the conductive layer comprises copper.

3. The thin film transistor substrate as claimed in claim 1, wherein the conductive layer comprises an alloy, which is a combination of copper and one of molybdenum, chromium, and tungsten.

4. The thin film transistor substrate as claimed in claim 1, wherein the gate electrode further comprises a barrier layer formed on the conductive layer.

5. The thin film transistor substrate as claimed in claim 4, wherein the barrier layer comprises one of titanium nitride, tantalum nitride, and tungsten nitride.

6. The thin film transistor substrate as claimed in claim 4, wherein the barrier layer has a thickness in the range from 5 to 30 nanometers.

7. The thin film transistor substrate as claimed in claim 1, wherein the bonding layer has a thickness in the range from 5 to 30 nanometers.

8. The thin film transistor substrate as claimed in claim 1, wherein the conductive layer has a thickness in the range from 200 to 400 nanometers.

9. The thin film transistor substrate as claimed in claim 1, wherein the bonding layer is an aluminum oxide layer.

10. The thin film transistor substrate as claimed in claim 9, wherein an adhesion strength between the bonding layer and the base substrate is about 48 joules per square meter.

11. The thin film transistor substrate as claimed in claim 1, wherein the bonding layer is a zirconium dioxide layer.

12. The thin film transistor substrate as claimed in claim 11, wherein an adhesion strength between the bonding layer and the base substrate is in the range from 53 joules per square meter to 79 joules per square meter.

13. The thin film transistor substrate as claimed in claim 1, wherein the bonding layer covers substantially the whole base substrate.

14. A method for fabricating a thin film transistor substrate, the method comprising:
    providing a base substrate;
    forming a bonding layer on the base substrate, the bonding layer comprising one of aluminum oxide and zirconium dioxide;
    plasma-treating a surface of the bonding layer to form a plurality of micro-grooves thereon;
    forming a conductive layer and a photo-resistor layer on the bonding layer;
    applying an exposing process on the photo-resistor layer through a mask and developing the photo-resistor layer;
    etching the conductive layer; and
    ashing the photo-resistor layer so as to obtain a gate electrode on the base substrate.

15. The method as claimed in the claim 14, wherein the surface of the bonding layer is plasma-treated with ammonia.

16. The method as claimed in the claim 15, wherein during the plasma-treatment with ammonia, a flow rate of ammonia is below 50 standard cubic centimeters per minute.

17. The method as claimed in the claim 14, wherein when the bonding layer is formed on the base substrate, oxygen is provided.

18. The method as claimed in the claim 17, wherein a flow rate of the oxygen is in the range from 5 to 15 standard cubic centimeters per minute.

19. A thin film transistor substrate, comprising:
    a base substrate; and
    a gate electrode formed on the base substrate, the gate electrode comprising:
    a bonding layer formed on the base substrate, the bonding layer comprising one of aluminum oxide and zirconium dioxide; and
    an electrically conductive layer formed on the bonding layer;
    wherein the conductive layer comprises at least one item selected from the group consisting of copper and copper alloy.

20. The thin film transistor substrate as claimed in claim 19, wherein the conductive layer comprises copper alloy, and the copper alloy is a combination of copper and one of molybdenum, chromium, and tungsten.

* * * * *